United States Patent [19]

Hase et al.

[11] Patent Number: 5,300,364
[45] Date of Patent: Apr. 5, 1994

[54] METAL-CLAD LAMINATES AND METHOD FOR PRODUCING SAME

[75] Inventors: Hiroaki Hase; Kazutsune Kikuta; Atsushi Takahashi, all of Chiba; Shiro Konotsune, Kanagawa, all of Japan

[73] Assignee: Chisso Corporation, Osaka, Japan

[21] Appl. No.: 849,416

[22] PCT Filed: Sep. 3, 1991

[86] PCT No.: PCT/JP91/01176

§ 371 Date: Apr. 29, 1992

§ 102(e) Date: Apr. 29, 1992

[87] PCT Pub. No.: WO92/04811

PCT Pub. Date: Mar. 19, 1992

[30] Foreign Application Priority Data

Sep. 4, 1990 [JP] Japan .................. 2-232575
Aug. 29, 1991 [JP] Japan .................. 3-242489

[51] Int. Cl.$^5$ ............ B32B 15/08; H05K 1/03; H05K 3/30; H05K 3/38
[52] U.S. Cl. ................. 428/458; 428/209; 428/457
[58] Field of Search ........... 428/458, 457, 209; 528/176

[56] References Cited

U.S. PATENT DOCUMENTS

| | | | |
|---|---|---|---|
| 4,778,872 | 10/1988 | Sasaki et al. | 528/176 |
| 4,937,133 | 6/1990 | Watanabe et al. | 428/209 |
| 4,939,039 | 6/1990 | Watanabe | 428/458 |
| 5,112,694 | 5/1992 | Konotsune et al. | 428/457 |

FOREIGN PATENT DOCUMENTS

| | | |
|---|---|---|
| 58-155790 | 9/1983 | Japan . |
| 59-22388 | 2/1984 | Japan . |
| 59-22389 | 2/1984 | Japan . |
| 61-111182 | 5/1986 | Japan . |
| 63-74635 | 4/1988 | Japan . |
| 63-181395 | 7/1988 | Japan . |
| 64-82928 | 3/1989 | Japan . |
| 2-194947 | 8/1990 | Japan . |

Primary Examiner—Paul J. Thibodeau
Assistant Examiner—D. S. Nakarani
Attorney, Agent, or Firm—Leydig, Voit & Mayer

[57] ABSTRACT

The present invention provides a flexible metal-clad laminate obtained by directly applying a polyimide precursor to a metallic conductive foil, and then drying, heating and curing the precursor to form a polyimide film, this flexible metal-clad laminate being characterized in that the polyimide film is composed of two or more polyimide layers, the linear thermal expansion coefficient of at least one of the second and later polyimide layers is larger than that of the first layer brought into contact with the metallic conductive foil, and the requirements of the following formulae are met:

$$3.0 < Q_{n-1} \times t_n < 50,$$

$$t_{n-1} > t_n \text{ and}$$

$$t_{n-1} > t_n \text{ and}$$

$$0.01 < \frac{Rz}{t_{n-1} \times t_n} < 0.10$$

wherein $t_n$ is the thickness (μm) of the outermost layer (the nth layer) of the polyimide layers, $t_{n-1}$ is the thickness (μm) of the film comprising the first layer to the (n−1)th layer of the polyimide layers, and $Q_{n-1}$ is a double value (cm) of the curvature radius of the curl of the film comprising the first layer to the (n−1)th layer of the polyimide layers and Rz is the average surface roughness (μm) of the metallic conductive foil. This board does not curl immediately after curing, and the curl does not occur even after the formation of a circuit by etching.

16 Claims, No Drawings

METAL-CLAD LAMINATES AND METHOD FOR PRODUCING SAME

TECHNICAL FIELD

The present invention relates to a polyimide flexible metal-clad laminate having no adhesive and a method for producing the same. More specifically, it relates to a method for producing a printed circuit board by the use of the above-mentioned metal-clad laminate and an electronic device in which electronic parts are mounted on the printed circuit board.

BACKGROUND ART

When a flexible metal-clad laminate (hereinafter referred to as "flexible metal-clad laminate") is etched to remove unnecessary portions of a conductive material from the board, a printed circuit board can be formed. On this printed circuit board, various electronic parts such as semiconductors are mounted, and the board is then incorporated into an electronic apparatus.

The mounting is to attach parts to the board by the use of soldering, screwing or the employment of wiring materials. Examples of the mounting means include parts insertion type mounting, surface mounting, flexible mounting, tip bonding mounting, controlled collapse bonding mounting and organic multitip mounting.

In recent years, the mounting density of the parts on this kind of printed printed circuit boards has increased year by year, and there is the tendency that the mounting means be automated. In these mounting steps, the automatic soldering is carried out at a high temperature, and therefore the boards are required to be heat-resistant.

Furthermore, in the step of circuit formation, a chemical or thermal change such as etching or washing is given, but it is required in this step that the board maintains an original plane state without curling and without separation between the metallic conductor and film used.

Each of the conventional polyimide flexible metal-clad laminates is mainly formed by causing a polyimide film to adhere to a metallic conductive foil with the interposition of an adhesive. However, since this laminate contains the adhesive, its heat resistance is poor and its electrical properties change with time, and therefore it is difficult to apply conventional boards to a field in which the high-density circuits are automatically mounted on the laminates.

As means for solving these problems, methods for producing a polyimide flexible metal-clad laminate having no adhesive have been disclosed in which there is directly applied, to a metallic conductive foil, a solution of a polyimide precursor having a linear thermal expansion coefficient substantially equal to that of the metallic conductive foil, followed by a thermal cure treatment to form a polyimide film thereon (Japanese Patent Application Laid-open Nos. 61-111359, 63-214185, 58-155790, 63-245988 and 61-111182).

The polyimide flexible metal-clad laminate having no adhesive not only solves the problem of deterioration by the adhesive but also permits the remarkable simplification of a manufacturing process and the decrease of cost. However, in order to prepare this polyimide flexible metal-clad laminate having no adhesive, it is necessary to select the polyimide having a linear thermal expansion coefficient substantially equal to that of the conductor, considering the curl properties of the laminate.

Nevertheless, the thus obtained flexible metal-clad laminate curls immediately after the curing, with the conductor foil facing to the outside. In addition, when the unnecessary portions of the conductor are removed by etching to form a circuit, the polyimide film curls, with the conductor foil facing to the inside, which interferes with the subsequent operation.

As a technique for controlling the curl immediately after the curing, Japanese Patent Application Laid-open Nos. 59-22388 and 59-22389 have disclosed a simple curl prevention method by which a reverse bending plastic deformation is given to the metal. In the case of this method, stress must be forcedly applied to the metal conductor, and thus the metal conductor is fatigued.

In addition, another method for preventing the board from curling has been disclosed in which the laminate is bent in a drying/curing step for the formation of the polyimide, as shown in Japanese Patent Application Laid-open No. 63-74635. In this method, facilities for bending the laminates are necessary in the drying/curing step.

With regard to a curl prevention method after the removal of the unnecessary portions of the conductor by etching, Japanese Patent Application Laid-open No. 63-181395 has disclosed a method in which the surface of polyimide is chemically etched after the removal of the unnecessary portions of the conductor by etching. However, in this method, a processing step is additionally required in addition to a production step. Moreover, Japanese Patent Application Laid-open Nos. 64-82928 and 1-245586 have disclosed an attempt in which a polyimide film is coated with plural polyimide layers having different thermal expansion coefficients to decrease the curl of the polyimide film. However, it is difficult to decrease the curl only by the formation of the plural layers having the different thermal expansion coefficients.

An object of the present invention is to provide a method for producing a flexible polyimide metal-clad laminate having no adhesive by which the above-mentioned problems can be solved and by which the curl of the laminate immediately after curing and the remaining curl of a polyimide film after the laminate etching for removing the unnecessary portions of the conductor can be controlled economically and practically.

Another object of the present invention is to provide a method for producing a printed circuit board from this flexible metal-clad laminate, and an electronic apparatus having the printed circuit board on which electronic parts are mounted.

The present inventors have investigated the curl appearance of a flexible metal-clad laminate which can be obtained in accordance with a method comprising directly applying a polyimide precursor solution onto a metallic conductive foil, and then subjecting the same to a thermal cure treatment to form a polyimide film, and as a result, they have found the following facts.

The first curl takes place at the time of the drying of the applied precursor solution and at the time of the subsequent thermal cure treatment, and the second curl appears at the time of the removal of the unnecessary portions of the metallic conductive foil by etching, and in the latter case, with the metallic conductive foil facing to the inside. The formation of the first curl is due to stress generated by the volume contraction of the polyimide film. However, most of this stress can be relieved by fixing the conductor so that the latter may not be bent at the time of the curing, and by providing a hysteresis or heat history higher than the glass transition point of the polyimide. On the other hand, the formation of the second curl would be due to the following fact: The molecular chains of the polyimide are difficult to move owing to the roughness on the interface between the polyimide film and the metallic conductive foil, so that the stress is scarcely relieved, and in consequence, the remaining stress layer is formed on the interface to form the second curl.

In addition, the degree of internal stress generated in the polyimide film depends upon the roughness on the surface of the metallic conductive foil which comes in contact with the polyimide film. When the roughness is large, the stress increases, and when the thickness of the polyimide film increases, the curl formation is inhibited by stress release after the etching owing to stiffness of the film.

The present invention has been completed on the basis of the above-mentioned knowledge.

DISCLOSURE OF THE INVENTION

Flexible metal-clad laminates of the present invention will be described in the following paragraphs (1) to (4).

(1) A flexible metal-clad laminate obtained by directly applying a polyimide precursor to a metallic conductive foil, and then drying, heating and curing the precursor to form a polyimide film, said flexible metal-clad laminate being characterized in that the polyimide film is composed of two or more polyimide layers, the linear thermal expansion coefficient of at least one of the second and later polyimide layers is larger than that of the first layer brought into contact with the metallic conductive foil, and the requirements of the following formulae are met:

$$3.0 < Q_{n-1} \times t_n < 50 \text{ and}$$

$$t_{n-1} > t_n$$

wherein $t_n$ is the thickness (μm) of the outermost layer (the nth layer) of the polyimide layers, $t_{n-1}$ is the thickness (μm) of the film comprising the first layer to the (n−1)th layer of the polyimide layers, and $Q_{n-1}$ is a double value (cm) of the curvature radius of the curl of the film comprising the first layer to the (n−1)th layer of the polyimide layers.

(2) The flexible metal-clad laminate described in the paragraph (1) wherein the linear thermal expansion coefficient of the first polyimide layer is from $1.0 \times 10^{-5}$ to $2.3 \times 10^{-5}$/°C., and the linear thermal expansion coefficient of the whole laminated polyimide film is from $1.5 \times 10^{-5}$ to $3.0 \times 10^{-5}$/°C.

(3) The flexible metal-clad laminate described in the paragraph (1) wherein the elasticity modulus of the first polyimide layer is from 500 to 800 kg/mm².

(4) The flexible metal-clad laminate described in the paragraph (1) wherein the requirements of the following formula are met:

$$0.01 < \frac{Rz}{t_{n-1} \times t_n} < 0.10 \quad (a)$$

wherein $t_{n-1}$ is the thickness (μm) of the film comprising the first layer to the (n−1)th layer of the laminated polyimide layers, $t_n$ is the thickness (μm) of the outermost layer (the nth layer) of the laminated polyimide layers, and Rz is the average surface roughness (μm) of the metallic conductive foil.

Methods for producing the flexible metal-clad laminates of the present invention are described in the following paragraphs (5) to (12).

(5) A method for producing a flexible metal-clad laminate in which either surface of a metallic conductive foil is covered with two or more polyimide layers, said method being characterized by comprising two or more steps of applying two or more polyimide precursor solutions onto the metallic foil and then drying the solutions in turn to form a composite plate, and a step of heating and curing the composite plate in which the two or more polyimide precursor layers are formed on the metallic conductive foil.

(6) The method for producing a flexible metal-clad laminate described in the paragraph (5) wherein the polyimide precursors are selected so that the linear thermal expansion coefficient of at least one of the second and later polyimide layers may be larger than that of the first layer brought into contact with the metallic conductive foil, and the requirements of the following formulae are met:

$$3.0 < Q_{n-1} \times t_n < 50 \text{ and}$$

$$t_{n-1} > t_n$$

wherein $t_n$ is the thickness (μm) of the outermost layer (the nth layer) of the laminated polyimide layers, $t_{n-1}$ is the thickness (μm) of the film comprising the first layer to the (n−1)th layer of the laminated polyimide layers, and $Q_{n-1}$ is a double value (cm) of the curvature radius of the curl of the film comprising the first layer to the (n−1)th layer of the laminated polyimide layers.

(7) The method for producing a flexible metal-clad laminate described in the paragraph (6) wherein the polyimide precursors are selected so that the linear thermal expansion coefficient of the first polyimide layer may be from $1.0 \times 10^{-5}$ to $2.3 \times 10^{-5}$/°C.

(8) The method for producing a flexible metal-clad laminate described in the paragraph (7) wherein the polyimide precursors are selected so that the linear thermal expansion coefficient of the second polyimide layer may be larger than that of the first polyimide layer.

(9) The method for producing a flexible metal-clad laminate described in the paragraph (6) wherein the polyimide precursors are selected so that the elasticity modulus of the first polyimide layer may be from 500 to 800 kg/mm².

(10) The method for producing a flexible metal-clad laminate described in the paragraph (6) wherein the requirements of the formula (a) in the preceding paragraph (4) are met.

(11) The method for producing a flexible metal-clad laminate described in the paragraph (8) wherein the number of the polyimide precursor layers is 3 or more, and the linear thermal expansion coefficient of the polyimide film obtained from the third and later precursor layers is larger than that of the polyimide layer brought into contact with the metallic foil.

(12) The method for producing a flexible metal-clad laminate described in any one of the paragraphs (5) to (11) wherein the amount of the remaining solvent contained in the polyimide precursor after the drying is from 5 to 300% by weight with respect to the polyimide film obtained by later heating and curing the precursor, and the imidation ratio of the polyimide precursor is from 0 to 90%.

A method for producing a printed circuit board of the present invention is described in the following paragraph (13).

(13) A method for producing a printed circuit board which comprises the step of etching the flexible metal-clad laminate described in any one of the paragraphs (1) to (4) to remove the unnecessary portions of a metallic conductor and to thereby form a circuit.

An electronic device of the present invention is described in the following paragraph (14).

(14) An electronic apparatus in which electronic parts are mounted on the printed circuit board described in the paragraph (13).

The polyimide layers of the flexible metal-clad laminate of the present invention includes suitably 2 to 20 layers, preferably 2 to 5 layers.

The thickness of each single polyimide layer is from 0.1 to 100 μm, preferably from 0.5 to 50 μm. When the thickness of the polyimide layer is less than the above-mentioned range, the application accuracy of the applied polyimide is poor, and so it is difficult to obtain a sufficient effect of curl inhibition. When it is more than the above-mentioned range, foaming tends to occur unpreferably in a drying/curing step of the polyimide precursor.

The thickness ($t_n$) of the nth polyimide layer (outermost layer) is less than that ($t_{n-1}$) of the first layer to the $(n-1)$th polyimide layer brought into contact with the metallic conductive foil, and $Q_{n-1}$ preferably meets the requirements of $$3.0 < Q_{n-1} \times t_n < 50$$

wherein $Q_{n-1}$ is a double value (cm) of the curvature radius of the curl of the polyimide film comprising the first layer to the $(n-1)$th layer, and the unit of $Q_{n-1} \cdot t_n$ is cm·μm.

When $Q_{n-1} \times t_n$ is more than the above-mentioned range, it is difficult to prevent the film from curling after the removal of the unnecessary portions of the metallic conductive foil by etching. Conversely, when it is less than the above-mentioned range, the stress generated in the first layer to the $(n-1)$th layer is largely removed by volume contraction in the curing step, so that the laminate curls. Moreover, after the removal of the unnecessary portions of the metallic conductive foil by the etching, the film curls unpreferably, with the film surface facing to the inside.

Furthermore, it is preferable that $t_{n-1}$ and $t_n$ meet the requirements of the above-mentioned formula (a). When $Rz/(t_{n-1} \times t_n)$ is in excess of 0.10, it is difficult to prevent the etched film from curling, and when it is less than 0.01, the stress generated in the first layer is largely removed by the volume contraction in the drying and curing step of the second layer, so that the laminate curls. Moreover, after the etching, the film curls unpreferably, with the film surface facing to the inside.

The linear thermal expansion coefficient of the whole polyimide layers of the present invention need not always be designed so as to be identical with that of the metallic conductive foil, but finally it is preferably $1.5 \times 10^{-5}$ to $3.0 \times 10^{-5}/°C.$, more preferably $1.5 \times 10^{-5}$ to $2.5 \times 10^{-5}/°C.$ In the present invention, the linear thermal expansion coefficient of the first layer formed in contact with either surface of the metallic conductive foil is preferably $1.0 \times 10^{-5}$ to $2.3 \times 10^{-5}/°C.$ Furthermore, the linear thermal expansion coefficient of the polyimide layer formed on the first layer is preferably 1.05 times or more, more preferably 1.1 times or more, on the other hand, 5 times or less, preferably 3 times or less as much as that of the first layer. When the coefficient falls off from the above-mentioned range, it is difficult to inhibit the flexible metal-clad laminate from curling.

In the present invention, the elasticity modulus of the first polyimide layer in contact with the metallic conductive foil is from 500 to 800 kg/mm².

In the preparation method of the flexible metal-clad laminate of the present invention, the two or more steps of applying two or more polyimide precursor solutions onto the metallic conductive foil in turn, drying and then heating the solutions concretely comprises the steps of preliminarily drying the polyimide precursor solution for the first layer applied to the metallic conductive foil, applying, prior to curing and at least once, the polyimide precursor solution having a larger linear thermal expansion coefficient than that of the first layer precursor after polyimidation, drying, and then heating for the polyimidation.

When the procedure includes applying the polyimide precursor onto the metallic conductive foil, drying the latter, and further applying the above-mentioned precursor solution thereon, the state of the polyimide precursor applied on the former layer is such that the amount of the remaining solvent therein is from 5 to 300% by weight, preferably 5 to 100% by weight. When the amount of the remaining solvent is less than the above-mentioned range, interlaminar separation tends to occur between the laminated polyimide films after the curing. Conversely, when it is more than the above-mentioned range, the migration of the polyimide precursor takes place between the layers, with the result that an effect which can be expected by covering the metallic conductor with the plural layers cannot be sufficiently obtained.

The imidation ratio of the polyimide precursor in the above-mentioned sate is from 0 to 90%, preferably 0 to 80%. When the imidation ratio is in excess of the above-mentioned range, interlaminar separation tends to occur between the laminated polyimide films after the curing.

The polyimide precursor solution which is applied on the metallic conductive foil is not always single, and it may be a mixture of two or more solutions or a copolymer thereof.

In the present invention, the polyimide which is finally formed on the metallic conductive foil substantially comprises structural units represented by the formula (I). The structural unit of the following formula (I) can be obtained by dehydrating and curing the polyamic acid unit represented by the formula (II).

Furthermore, the polyimide precursor in the present invention is composed of the structural unit of formula (II) or the structural units of formulae (I) and (II).

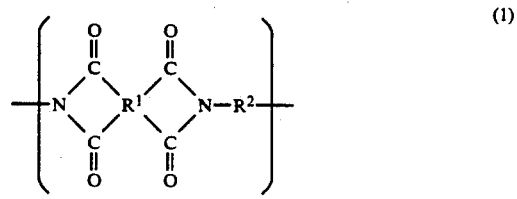

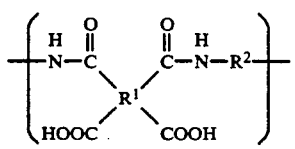

(wherein R¹ is a tetravalent organic group, and R² is a divalent organic group).

R¹ is particularly a tetravalent aliphatic group having 2 or more carbon atoms, an alicyclic group, a carbon cyclic or carbocyclic aromatic group or a heterocyclic group. These groups may be substituted by one or more of, for example, a halogen atom (e.g., fluorine, chlorine or bromine), or an alkyl group having 1 to 4 carbon atoms.

In the case that R¹ is the carbon cyclic aromatic group, this group preferably has at least one six-membered ring. In particular, R¹ is a monocyclic aromatic group, a condensed polycyclic aromatic group or a polycyclic aromatic group having several condensed rings or non-condensed rings (which are bonded to each other directly or via a crosslinking group).

Suitable examples of the above-mentioned crosslinking group are as follows:

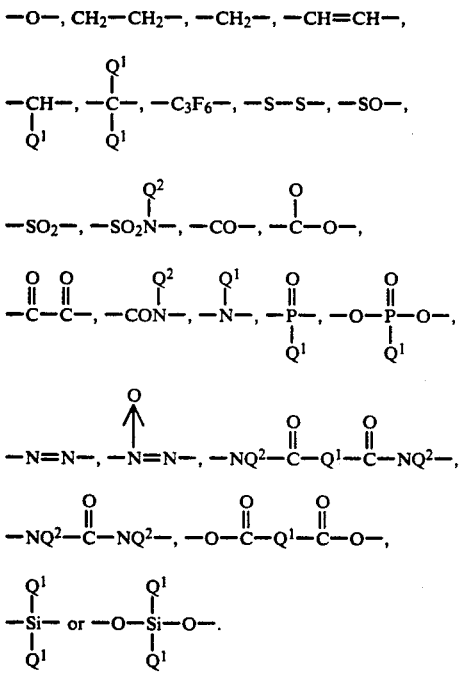

Here, in a certain case, $Q^1$ is an alkyl group or an alkylene group which may be substituted by one or more of halogen atoms (preferably a fluorine atom) and which has 1 to 6 carbon atoms, preferably 1 to 4 carbon atoms, a cycloalkyl group, an aryl group or an arylene group.

$Q^2$ is a hydrogen atom, a cycloalkyl group or an aryl group, or in a certain case, it is an alkyl group which is substituted by one or more of halogen atoms and which has 1 to 4 carbon atoms.

When R¹ is a heterocyclic group, examples of the heterocyclic group include a heterocyclic aromatic group having a five-membered or a six-membered ring containing oxygen, nitrogen and/or sulfur, or a condensed cyclic group of the same and a benzene ring.

The carbon cyclic aromatic group or the heterocyclic ring represented by R¹ may be substituted by one or more of, for example, a nitro group, an alkyl group having 1 to 4 carbon atoms, a trifluoromethyl group, a halogen atom (particularly a fluorine atom), a silyl group and an alphamoyl group.

When R¹ is an aliphatic group, an example of the aliphatic group is particularly a chain saturated hydrocarbon group having 2 to 12 carbon atoms or a chain saturated hydrocarbon group having a hydrocarbon chain in which a hetero-atom such as an O atom, an S atom or an N atom is present.

When R¹ is the cyclic aliphatic group, an example of the cyclic aliphatic group is a group of cyclobutane, a group of methyl-substituted cyclobutane, a group of cyclohexane or a group of dicyclohexane.

With regard to R¹, the respective groups of R¹ are mutually independent, and each of them is preferably a non-substituted monocyclic aromatic group, a non-substituted condensed polycyclic aromatic group or a non-substituted non-condensed bicyclic aromatic group. The last group is a group in which aromatic rings are bonded to each other via a crosslinking group such as —O— or —CO—.

R² is particularly a divalent aliphatic group having 2 or more carbon atoms, an alicyclic group, an aromatic group, a carbon cyclic, or carbocyclic, aromatic group, a heterocyclic group or an organic polysiloxane group represented by the following formula (III). These groups may be substituted by, for example, one or more of a halogen atom (e.g., fluorine, chlorine or bromine atom), an alkyl group and an alkoxy group having 1 to 4 carbon atoms.

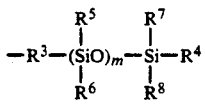

(wherein $R^3$ and $R^4$ may be identical or different, and each of them is a lower alkylene group or a phenylene group, $R^5$, $R^6$, $R^7$ and $R^8$ may be identical or different, and each of them is a lower alkylene group, a lower alkoxy group, a phenyl group or a phenoxy group, and m is an integer of from 1 to 100).

When R² is a carbon cyclic aromatic group, a preferable example of the carbon cyclic aromatic group is a monocyclic aromatic group, a condensed polycyclic aromatic group or a non-condensed bicyclic aromatic group. In this non-condensed bicyclic aromatic group, aromatic rings are bonded to each other via a crosslinking group. In this case, the usable example of the crosslinking group is the same as mentioned in the preceding paragraph in which R¹ is described.

When R² is an heterocyclic group, an example of the heterocyclic group is particularly a heterocyclic aromatic group having a five-membered or a six-membered ring containing oxygen, nitrogen and/or sulfur.

When R² is an aliphatic group, an example of the aliphatic group is particularly an alkylene group having 2 to 12 carbon atoms or an alkylene group having an alkylene chain in which a hetero-atom such as an O atom, a S atom or a N atom is present.

When R² is an alicyclic group, an example of the alicyclic group is a cyclohexyl group or a dicyclohexylmethane group. On the other hand, when $R^2$ is an aromatic aliphatic group, particular examples of the aromatic aliphatic group include a group of 1,3-, 1,4- or 2,4-bisalkylbenzene, 4,4'-bis-alkylene-diphenyl group and 4,4'-bis-alkylene-diphenyl ether group.

With regard to $R^2$, the respective groups of $R^2$ are mutually independent, and in a certain case, each of them is preferably an alkyl group or an alkoxy group having 1 to 4 carbon atoms, a monocyclic aromatic group or a non-condensed bicyclic aromatic group having one or more halogen atoms as substituents, a non-substituted monocyclic aromatic group or a non-substituted aliphatic group having 2 to 10 carbon atoms.

Examples of the lower alkylene group represented by $R^3$ and $R^4$ in the formula (III) include alkylene groups having 1 to 6 carbon atoms such as a methylene group, an ethylene group, a trimethylene group, a tetramethylene group, a pentamethylene group and a hexamethylene group.

Examples of the alkylene group represented by $R^5$, $R^6$, $R^7$ and $R^8$ include alkyl groups having 1 to 6 carbon atoms such as a methyl group, an ethyl group, a pentyl group and a hexyl group. Examples of the lower alkoxy group represented by $R^5$, $R^6$, $R^7$ and $R^8$ include alkoxy groups having 1 to 6 carbon atoms such as a methoxy group, an ethoxy group, a propoxy group, an isopropoxy group, a butoxy group, an isobutoxy group, a tert-butoxy group, a pentyloxy group and a hexyloxy group.

Next, the polyimide precursor containing the polyamic acid units represented by the formula (II) can be obtained by a reaction in organic solvents of an organic tetracarboxylic acid dianhydride represented by the following formula (IV) and an aromatic or an aliphatic diamine or α, ω̄-diaminosiloxane represented by the following formula (V).

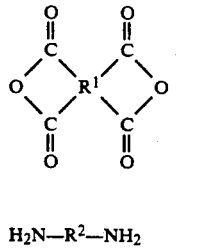
(IV)

$H_2N-R^2-NH_2$ (V)

wherein $R^1$ and $R^2$ are as defined above.

Typical examples of the tetracarboxylic acid dianhydride represented by the above-mentioned formula (IV) include the following compounds, and these acid dianhydrides can be used singly or in combination.

Examples of the tetracarboxylic acid dianhydride include pyromellitic acid dianhydride, benzene-1,2,3,4-tetracarboxylic acid dianhydride, 2,2',3,3'-benzophenonetetracarboxylic acid dianhydride, 2,3,3',4'-benzophenonetetracarboxylic acid anhydride, 3,3',4,4'-benzophenonetetracarboxylic acid dianhydride, 2,2',3,3'-biphenyltetracarboxylic acid dianhydride, 3,3',4,4'-biphenyltetracarboxylic acid dianhydride, 2,3,3',4'-biphenyltetracarboxylic acid dianhydride, 2,3,6,7-naphthalenetetracarboxylic acid dianhydride, 3,4,9,10-perylenetetracarboxylic acid dianhydride, 2,3,6,7-anthracenetetracarboxylic acid dianhydride, 1,2,7,8-phenanthrenetetracarboxylic acid dianhydride, bis(2,3-dicarboxyphenyl)methane dianhydride, bis(3,4-dicarboxyphenyl)methane dianhydride, 1,2,5,6-naphthalenetetracarboxylic acid dianhydride, 2,2-bis(2,3-dicarboxyphenyl)propane dianhydride, 2,2-bis(3,4-dicarboxyphenyl)propane dianhydride, 1,1-bis(2,3-dicarboxyphenyl)ethane dianhydride, bis(3,4-dicarboxyphenyl)sulfone dianhydride, bis(3,4-dicarboxyphenyl)ether dianhydride, 3,3',4,4'-tetracarboxybenzooxybenzene dianhydride, N,N-(3,4-dicarboxyphenyl)N-methylamine dianhydride, thiophene-2,3,4,5-tetracarboxylic acid dianhydride, pyrazine-2,3,5,6-tetracarboxylic acid dianhydride, pyridine-2,3,5,6-tetracarboxylic acid dianhydride, 1,2,3,4-butanetetracarboxylic acid dianhydride, pentanetetracarboxylic acid dianhydride, 1,2,3,4-cyclopentanetetracarboxylic acid dianhydride, 1,2,3,4-bicyclohexenetetracarboxylic acid dianhydride, 1,2,3,4-tetrahydrofurantetracarboxylic acid dianhydride, 1,2,3,4-cyclobutanetetracarboxylic acid dianhydride and 2,3,5-tricarboxycyclopentylacetic acid dianhydride.

Examples of the diamine compound represented by the above-mentioned formula (V) include carbon cyclic, or carbocyclic, aromatic diamines, heterocyclic diamines, aliphatic diamines, alicyclic diamines and aromatic aliphatic diamines, and these diamines can be used singly or in combination.

Particular examples of the carbon cyclic aromatic diamines include the following compounds:

o-, m- and p-phenylenediamine, diaminotoluenes (e.g., 2,4-diaminotoluene), 1,4-diamino-2-methoxybenzene, 2,5-diaminoxylenes, 1,3-diamino-4-chlorobenzene, 1,4-diamino-2,5-dichlorobenzene, 1,4-diamino-2-bromobenzene, 1,3-diamino-4-isopropylbenzene, N,N-diphenyl-1,4-phenylenediamine, 4,4'-diaminophenyl-2,2-propane, 4,4'-diaminophenylmethane, 2,2'-diaminostilbene, 4,4'-diaminostilbene, 4,4'-diaminophenyl ether, 4,4'-diaminophenyl thioether, 4,4'-diaminodiphenylsulfone, 3,3'-diaminodiphenylsulfone, 4,4'-diaminobenzoic acid phenyl ester, 2,2'-diaminobenzophenone, 4,4'-diaminobenzophenone, 4,4'-diaminobenzyl, 4-(4'-aminophenylcarbamoyl)-aniline, bis(4-aminophenyl)-phosphine oxide, bis(4-aminophenyl)-methylphosphine oxide, bis(3-aminophenyl)-methylsulfine oxide, bis(4-aminophenyl)-phenylphosphine oxide, bis(4-aminophenyl)-cyclohexylphosphine oxide, N,N-bis(4-aminophenyl)-N-phenylamine, N,N-bis(4-aminophenyl)-N-methylamine, 4,4'-diaminodiphenylurea, 1,8-diaminonaphthalene, 1,5-diaminonaphthalene, 1,5-diaminoanthraquinone, diaminofluoranthene and 4,4'-diaminobenzanilide.

Examples of the heterocyclic diamines include the following compounds:

2,6-diaminopyridine, 2,4-diaminopyridine, 2,4-diamino-s-triazine, 2,7-diamino-dibenzofuran, 2,7-diaminocarbazole, 3,7-diaminophenothiazine and 2,5-diamino-1,3,4-thiadiazol.

Examples of the aliphatic diamines include the following compounds:

Dimethylenediamine, trimethylenediamine, tetramethylenediamine, hexamethylenediamine, heptamethylenediamine, octamethylenediamine, nonamethylenediamine, decamethylenediamine, 2,2-dimethylpropylenediamine, 2,5-dimethylhexamethylenediamine, 2,5-dimethylheptamethylenediamine, 4,4-dimethylheptamethylenediamine, 3-methoxyhexamethylenediamine, 5-methylnonamethylenediamine, 2,11-diaminododecane, 1,12-diaminooctadecane, 1,2-bis(3-aminopropoxy)ethane, N,N'-dimethyl-ethylenediamine, N,N'-diethyl-1,3-diaminopropane, N,N'-dimethyl-1,6-diaminohexane, diamines represented by the formula $H_2N(CH_2)_3O(CH_2)_2O(CH_2)_3NH_2$, and diamines represented by the formula $H_2N(CH_2)_3S(CH_2)_3NH_2$.

Suitable compounds of the alicyclic diamine include 1,4-diaminocyclohexane and 4,4'-diamino-dicyclohexylmethane, and suitable examples of the aromatic aliphatic diamine include 1,4-bis(2-methyl-4-aminopentyl)-benzene, 1,4-bis(1,1-dimethyl-5-aminopentyl)-benzene, 1,3-bis(aminomethyl)-benzene and 1,4-bis-(aminomethyl)-benzene.

Examples of the $\alpha, \bar{\omega}$-diaminosiloxane represented by the formula (V) include the following compounds, and they can be used singly or in combination.

Typical examples of the $\alpha, \bar{\omega}$-diaminosiloxane include 1,1,3,3-tetramethyl-1,3-bis(4-aminophenyl)disiloxane, 1,1,3,3-tetraphenoxy-1,3-bis(4-aminoethyl)disiloxane, 1,1,3,3,5,5-hexamethyl-1,5-bis(4-aminophenyl)trisiloxane, 1,1,3,3-tetraphenyl-1,3-bis(2-aminoethyl)disiloxane, 1,1,3,3-tetraphenyl-1,3-bis(3-aminopropyl)disiloxane, 1,1,5,5- tetraphenyl-3,3-dimethyl-1, 5-bis(3-aminopropyl)trisiloxane, 1,5,5-tetraphenyl-3,3-dimethoxy-1,5-bis(4-aminobutyl)trisiloxane, 1,1,5,5-tetraphenyl-3,3-dimethoxy-1,5-bis(5-aminophenyl)trisiloxane, 1,1,3,3-tetramethyl-1,3-bis(2-aminoethyl)disiloxane, 1,1,3,3-tetramethyl-1,3-bis(3-aminopropyl)disiloxane, 1,1,3,3-tetramethyl-1,3-bis(4-aminobutyl)disiloxane, 1,3-dimethyl-1,3-dimethoxy-1,3-bis(4-aminobutyl)disiloxane, 1,1,5,5-tetramethyl-3,3-dimethoxy-1,5-bis(2-aminoethyl)-trisiloxane, 1,1,5,5-tetramethyl-3,3-dimethoxy-1,5-bis(3-aminopropyl)trisiloxane, 1,1,5,5-tetramethyl-3,3-dimethoxy-1,5-bis(4-aminobutyl)trisiloxane, 1,1,5,5-tetramethyl-3,3-dimethoxy-1,5-bis(5-aminopentyl)trisiloxane, 1,1,3,3,5,5-hexamethyl-1,5-bis(3-aminopropyl)-trisiloxane, 1,1,3,3,5,5-hexaethyl-1,5-bis(3-aminopropyl)trisiloxane and 1,1,3,3,5,5-hexapropyl-1,5-bis(3-aminopropyl)trisiloxane. The amount of $\alpha, \bar{\omega}$-diaminosiloxane to be used is from 0.01 to 20 mole %, preferably from 0.01 to 5 mole % with respect to the total weight of the diamine.

Examples of the organic solvent which can be used in the synthetic reaction of polyamic acid include polar organic solvents such as N,N-dimethylacetamide, N,N-diethylamide, N,N-dimethylformamide, N,N-dimethylmethoxyacetamide, N-methyl-2-pyrrolidone, N-acetyl-2-pyrrolidone, hexamethylphosphoric acid triamide (Hexametapol), N,N,N,N-tetramethylurea, tetrahydrofuran, cyclohexanone, tetrahydrothiophene dioxide and methyl sulfoxide. They can be used singly or in the form of a mixture of two or more thereof. In addition, they can be mixed with xylene, toluene, ethylene glycol monoethyl ether or the like.

No particular restriction is put on the material of the metallic conductive foil which can be used in the present invention, but a foil made of copper, aluminum, silver, gold, iron, an alloy of nickel and chromium or the like can be used. Furthermore, the metallic conductive foil may be subjected to nickel plating, or a chemical or mechanical surface treatment with an aluminum alcoholate, an aluminum chelate, a silane coupling agent or the like.

In the present invention, no particular restriction is put on the manner of forming a polyimide film layer on the metallic conductive foil, but the formation of the polyimide film layer thereon can be achieved by applying a varnish containing 1 to 50% by weight of the polyimide precursor on the surface of the metallic foil in accordance with an extrusion casting method using a roll coater, a comma coater, a knife coater, a doctor blade, a flow coater, a close coater, a liver coater, a gear or the like, and then drying the varnish at 60° to 200° C.

Next, a multi-layer film of the polyimide precursor is formed by repeating such an application, and then heated to cure itself.

A curing temperature is from 200° to 450° C., preferably from 300° to 430° C.

In the present invention, the drying and the curing can be preferably carried out in an inert gas atmosphere to prevent the polyimide film and the metallic conductive foil from deteriorating under the influence of oxygen.

The thus obtained flexible metal-clad laminate is then etched in a known manner to remove unnecessary portions of the metallic conductive foil, thereby forming a conductive circuit. Afterward, this circuit is covered with an insulating film and then perforated to obtain a printed circuit board.

Semiconductor devices such as LSIs and other electronic parts can be mounted on the above-mentioned printed circuit board in a known manner, thereby producing an electronic apparatus.

The flexible metal-clad laminate of the present invention is characterized in that the curl of the polyimide film formed when the unnecessary portions of the metallic conductive foil are removed therefrom by etching can be inhibited by eliminating stress generated in the plural inside layers owing to volume contraction in the drying and curing of the outermost layer by the utilization of a difference between the linear thermal expansion coefficients of the plural polyimide films.

BEST MODE FOR CARRYING OUT THE INVENTION

The present invention will be described in detail with reference to examples and comparative examples, but it should not be limited to these examples.

A linear thermal expansion coefficient was calculated in the range of 100° to 250° C. by the use of a thermomechanical analyzer (TMA) for a specimen in which an imidation reaction was sufficiently carried out.

An elasticity modulus was measured for a specimen in which an imidation reaction was sufficiently carried out in accordance with ASTM D638 by the use of a tensile testing machine.

A $Q_{n-1}$ value of a polyimide film was calculated as follows: A flexible metal-clad laminate was entirely etched with a ferric chloride solution to remove a metallic conductive foil, and a film having a size of 10 cm × 10 cm was formed. Afterward, this film was dried at 100° C. for 10 minutes, and the curvature radius (cm) of the resultant curl was measured. Thus, the $Q_{n-1}$ value was obtained by doubling the curvature radius. In the examples, $Q_1$ was a Q value of one inside layer in the case of the two layers, $Q_2$ was a Q value of two inside layers in the case of the three layers, and $Q_m$ was a Q value of all the polyimide layers.

The curl of the flexible metal-clad laminate was shown by a curl value obtained by measuring a curvature radius (cm) of the laminate after curing, and then doubling the measured curvature radius.

The remaining solvent ratio was calculated from the weight reduction of a dried polyimide precursor by a thermogravimetric analyzer (TGA).

The imidation ratio was a percent of the light absorption quantity of an imide group at an absorption wavelength of 1780 $cm^{-1}$ by infrared spectrophotometry to the light absorption quantity of an imide group in the case that the same sample was subjected to imidation to 100%.

Copper foils which were used in the examples were products having the trade name JTC made by Nippon Mining Co., Ltd. and having a thickness of 35 μm and an average surface roughness Rz of 7 μm. This average surface roughness was measured by the use of a three-dimensional surface roughness meter.

SYNTHESIS EXAMPLE 1

Preparation of a Polyimide Precursor Solution [I]

47.43 g (0.439 mole) of paraphenylenediamine (hereinafter abbreviated to "p-PDA") as a diamine component and 1000 g of N,N-dimethylacetamide as a synthetic solvent were placed in a 2-liter reaction vessel equipped with a thermometer, a stirrer and a nitrogen inlet, while a nitrogen gas was blown into the reaction vessel at 50 ml/minute. Next, 129.03 g (0.439 mole) of 3,3',4,4'-biphenyltetracarboxylic acid dianhydride (hereinafter abbreviated to "s-BPDA") were gradually added as an acid anhydride to the mixture, while the mixture was cooled to 20° C., and the mixture was then stirred for 6 hours to carry out a polymerization reaction, thereby obtaining a polyimide precursor solution [I] having a solids concentration of 15% by weight.

The viscosity of this polyimide precursor solution [I] was 56000 cps. This solution was then applied to a copper foil by flow casting so that the thickness of a film after polyimidation might be 30 μm, followed by drying at 100° C. for 10 minutes, by heating afterward up to 350° C. over one hour and then by heat curing at 350° C. for 30 minutes to perform imidation, thereby obtaining a flexible metal-clad laminate. This laminate was etched with a ferric chloride solution to obtain a polyimide film. The linear thermal expansion coefficient and the elasticity modulus of this film were $1.5 \times 10^{-5}$/°C. and 760 kg/mm$^2$, respectively.

SYNTHESIS EXAMPLE 2

Preparation of a Polyimide Precursor Solution [II]

The same procedure as in Synthesis Example 1 was effected except that 71.46 g (0.357 mole) of 4,4'-diamino diphenyl ether (hereinafter abbreviated to "DDE") as a diamine component and 105.00 g (0.357 mole) of s-BPDA as an acid anhydride component were used, thereby obtaining a polyimide precursor solution [II].

The viscosity of this polyimide precursor solution [II] was 48000 cps. The linear thermal expansion coefficient and the elasticity modulus of this polyimide film obtained in the same manner as in Synthesis Example 1 were $3.0 \times 10^{-5}$/°C. and 310 kg/mm$^2$, respectively.

SYNTHESIS EXAMPLE 3

Preparation of a Polyimide Precursor Solution [III]

The same procedure as in Synthesis Example 1 was effected except that 84.46 g (0.422 mole) of DDE as a diamine component and 92.01 g (0.422 mole) of pyromellitic acid dianhydride as an acid anhydride component were used, thereby obtaining a polyimide precursor solution [III].

The viscosity of this polyimide precursor solution [II] was 43000 cps. The linear thermal expansion coefficient and the elasticity modulus of a polyimide film obtained from this precursor in the same manner as in Synthesis Example 1 were $3.0 \times 10^{-5}$/°C. and 300 kg/mm$^2$, respectively.

(Preparation of a Polyimide Precursor Solution (1))

The polyimide precursor solutions [I] and [II] were mixed in a molar ratio of 8:2, followed by sufficiently stirring to obtain a polyimide precursor solution (1).

The linear thermal expansion coefficient and the elasticity modulus of a polyimide film obtained from this solution in the same manner as in Synthesis Example 1 were $1.8 \times 10^{-5}$/°C. and 610 kg/mm$^2$, respectively.

(Preparation of a Polyimide Precursor Solution (2))

The polyimide precursor solutions [I] and [II] were mixed in a molar ratio of 6:2, followed by sufficiently stirring to obtain a polyimide precursor solution (2).

The linear thermal expansion coefficient of a polyimide film obtained from this solution in the same manner as in Synthesis Example 1 was $2.4 \times 10^{-5}$/°C.

EXAMPLE 1

A polyimide precursor solution [I] was applied to a copper foil by flow casting so that the thickness of a film after polyimidation might be 24 μm, followed by drying at 80° C. for 5 minutes. The resultant polyimide precursor layer had a remaining solvent ratio of 120% and an imidation ratio of 8%, and the film after the polyimidation had a $Q_1$ value of 1.1 cm.

A polyimide precursor solution [II] was applied to this precursor layer by flow casting so that the thickness of a film after polyimidation might be 6 μm, followed by drying at 100° C. for 10 minutes, by heating afterward up to 350° C. over one hour and then by heat curing at 350° C. for 30 minutes. As a result, the precursor became two layers of the polyimide, thereby obtaining a flexible metal-clad laminate. Its $Q_{n-1} \cdot t_n$ value was 6.6.

The thus obtained flexible metal-clad laminate did not curl, and even when the conductor was removed after etching, the formation of the curl was not observed. The linear thermal expansion coefficient of the total polyimide film comprising the two layers was $1.9 \times 10^{-5}$/°C.

EXAMPLE 2

A polyimide precursor solution [I] was applied onto a copper foil by flow casting so that the thickness of a film after polyimidation might be 15 μm, followed by drying at 200° C. for 30 minutes. The resultant polyimide precursor layer had a remaining solvent ratio of 4% and an imidation ratio of 85%, and the film after the polyimidation had a $Q_1$ value of 0.7 cm.

A polyimide precursor solution [III] was applied to this precursor layer by flow casting so that the thickness of a film after polyimidation might be 10 μm, followed by drying at 100° C. for 10 minutes, by heating afterward up to 850° C. over one hour and then by heat curing at 350° C. for 30 minutes. As a result, the precursor became two layers of the polyimide, thereby obtaining a flexible metal-clad laminate. Its $Q_{n-1} \cdot t_n$ value was 7.0.

The thus obtained flexible metal-clad laminate did not curl, and even when the conductor was removed after etching, the formation of the curl was not observed. The linear thermal expansion coefficient of the total polyimide film comprising the two layers was $2.4 \times 10^{-5}$/°C.

EXAMPLE 3

The above-mentioned precursor solution (1) was applied to a copper foil by flow casting so that the thickness of a film after polyimidation might be 20 μm, followed by drying at 100° C. for 10 minutes. The resultant polyimide precursor layer had a remaining solvent ratio of 85% and an imidation ratio of 10%, and the film after the polyimidation had a $Q_1$ value of 1.5 cm.

The above-mentioned precursor solution (2) was applied to this precursor layer by flow casting so that the thickness of a film after polyimidation might be 10 μm, followed by drying at 100° C. for 10 minutes, by heating afterward up to 350° C. over one hour and then by heat curing at 350° C. for 30 minutes. As a result, the precursor became two layers of the polyimide, thereby obtaining a flexible metal-clad laminate. Its $Q_{n-1} \cdot t_n$ value was 15.

The thus obtained flexible metal-clad laminate did not curl, and even after etching, the formation of the curl was not observed. The linear thermal expansion coefficient of the total polyimide film comprising the two layers was $2.0 \times 10^{-5}/°C$.

SYNTHESIS EXAMPLE 4

Preparation of a Polyimide Precursor Solution [A]

The same procedure as in Synthesis Example 1 was effected except that 41.73 g (0.386 mole) of p-PDA and 8.59 g (0.043 mole) of DDE were used as diamine components and 126.15 g (0.429 mole) of s-BPDA were used as an acid anhydride component, thereby obtaining a polyimide precursor solution [A].

SYNTHESIS EXAMPLE 5

Preparation of a Polyimide Precursor Solution [C]

The same procedure as in Synthesis Example 1 was effected except that 30.30 g (0.280 mole) of p-PDA and 43.14 g (0.07 mole) of α, ω-di-(3-aminopropyl)-polydimethylsiloxane were used as diamine components and 103.03 g (0.350 mole) of s-BPDA were used as an acid anhydride component, thereby obtaining a polyimide precursor solution [C].

Preparation of a Polyimide Precursor Solution [IV]

Polyimide precursor solutions [A] and [C] were mixed in a molar ratio of 20:1, followed by stirring to obtain a polyimide precursor solution [IV]. The viscosity of this polyimide precursor solution [IV] was 78000 cps. The linear thermal expansion coefficient and the elasticity modulus of a polyimide film obtained from this precursor solution [IV] in the same manner as in Synthesis Example 1 were $1.8 \times 10^{-5}/°C$ and 620 kg/mm², respectively.

SYNTHESIS EXAMPLE 6

Preparation of a Polyimide Precursor Solution [B]

The same procedure as in Synthesis Example 1 was effected except that 32.67 g (0.302 mole) of p-PDA and 19.99 g (0.100 mole) of DDE were used as diamine components and 118.22 g (0.402 mole) of s-BPDA were used as an acid anhydride component, thereby obtaining a polyimide precursor solution [B].

Preparation of a Polyimide Precursor Solution [V]

Polyimide precursor solutions [B] and [C] were mixed in a molar ratio of 10:1, followed by stirring to obtain a polyimide precursor solution [V]. The viscosity of this polyimide precursor solution [V] was 65000 cps. The linear thermal expansion coefficient and the elasticity modulus of a polyimide film obtained in the same manner as in Synthesis Example 1 were $2.2 \times 10^{-5}/°C$ and 570 kg/mm², respectively.

SYNTHESIS EXAMPLE 7

Preparation of a Polyimide Precursor Solution [D]

The same procedure as in Synthesis Example 1 was effected except that 26.07 g (0.241 mole) of p-PDA and 32.18 g (0.161 mole) of DDE were used as diamine components and 118.22 g (0.402 mole) of s-BPDA were used as an acid anhydride component, thereby obtaining a polyimide precursor solution [D].

Preparation of a Polyimide Precursor Solution [VI]

Polyimide precursor solutions [D] and [C] were mixed in a molar ratio of 20:1, followed by stirring to obtain a polyimide precursor solution [VI]. The viscosity of this polyimide precursor solution [VI] was 56000 cps. The linear thermal expansion coefficient and the elasticity modulus of a polyimide film obtained in the same manner as in Synthesis Example 1 were $2.4 \times 10^{-5}/°C$ and 520 kg/mm², respectively.

EXAMPLE 4

A polyimide precursor solution [IV] was applied to a copper foil by flow casting so that the thickness of a film after polyimidation might be 21 μm, followed by drying at 100° C. for 5 minutes. The resultant polyimide precursor layer had a remaining solvent ratio of 95% and an imidation ratio of 5%, and the film after the polyimidation had a $Q_1$ value of 1.7 cm.

A polyimide precursor solution [VI] was applied onto this precursor layer by flow casting so that the thickness of a film after polyimidation might be 10 μm, followed by drying at 100° C. for 10 minutes, by heating afterward up to 350° C. over one hour and then by heat curing at 350° C. for 30 minutes. As a result, the precursor film became two layers of the polyimide, thereby obtaining a flexible metal-clad laminate. Its $Q_{n-1} \cdot t_n$ value was 17.

The thus obtained flexible metal-clad laminate did not curl, and even when the conductor was removed after etching, the formation of the curl was not observed. The linear thermal expansion coefficient of the total polyimide film comprising the two layers was $2.1 \times 10^{-5}/°C$.

EXAMPLE 5

A polyimide precursor solution [V] was applied to a copper foil by flow casting so that the thickness of a film after polyimidation might be 23 μm, followed by drying at 100° C. for 5 minutes. The resultant polyimide precursor layer had a remaining solvent ratio of 95% and an imidation ratio of 5%, and the film after the polyimidation had a $Q_1$ value of 1.8 cm.

A polyimide precursor solution [VI] was applied to this precursor layer by flow casting so that the thickness of a film after the polyimidation might be 8 μm, followed by drying at 100° C. for 10 minutes, by heating afterward up to 350° C. over one hour and then by heat curing at 350° C. for 30 minutes. As a result, the precursor film became two layers of the polyimide, thereby obtaining a flexible metal-clad laminate. Its $Q_{n-1} \cdot t_n$ value was 10.4.

The thus obtained flexible metal-clad laminate did not curl, and even when the conductor was removed after etching, the formation of the curl was not observed. The linear thermal expansion coefficient of the total polyimide film comprising the two layers was 2.2×10$^{-5}$/°C.

EXAMPLE 6

A polyimide precursor solution [IV] was applied to a copper foil by flow casting so that the thickness of a film after polyimidation might be 10 μm, followed by drying at 100° C. for 5 minutes. The resultant polyimide precursor layer had a remaining solvent ratio of 95% and an imidation ratio of 5%.

A polyimide precursor solution [IV] was applied to this precursor layer by flow casting so that the thickness of a film after polyimidation might be 10 μm, followed by drying at 100° C. for 5 minutes. The second polyimide precursor layer had a remaining solvent ratio of 95% and an imidation ratio of 5%. The film comprising these two layers after the polyimidation had a $Q_2$ value of 1.5 cm.

A polyimide precursor solution [VI] was further applied to this layer by flow casting so that the thickness of a film after the polyimidation might be 10 μm, followed by drying at 100° C. for 10 minutes, by heating afterward up to 350° C. over one hour and then by heat curing at 350° C. for 30 minutes.

As a result, the precursor film became three layers of the polyimide, thereby obtaining a flexible metal-clad laminate. Its $Q_{n-1} \cdot t_n$ value was 15.

The thus obtained flexible metal-clad laminate did not curl, and even when the conductor was removed after etching, the formation of the curl was not observed. The linear thermal expansion coefficient of the total polyimide film comprising the three layers was 2.1×10$^{-5}$/°C.

COMPARATIVE EXAMPLE 1

A polyimide precursor solution [I] obtained in Synthesis Example 1 was applied to a copper foil by flow casting so that the thickness of a polyimide film might be 26 μm, followed by drying at 100° C. for 10 minutes, by heating afterward up to 350° C. over one hour and then by heat curing at 350° C. for 30 minutes.

As a result, the precursor layer became the polyimide film of one layer, thereby obtaining a flexible metal-clad laminate.

The thus obtained flexible metal-clad laminate did not curl, but the film from which the conductor was removed after etching had a $Q_m$ value of 0.7 cm.

COMPARATIVE EXAMPLE 2

A polyimide precursor solution [II] obtained in Synthesis Example 2 was applied to a copper foil by flow casting so that the thickness of a film after polyimidation might be 25 μm, and the same procedure as in Comparative Example 1 was then carried out to obtain a flexible metal-clad laminate.

The thus obtained flexible metal-clad laminate formed a curl having a diameter of 3.0 cm, but when the conductor was removed after etching, any formation of the curl was not observed.

COMPARATIVE EXAMPLE 3

A polyimide precursor solution [III] obtained in Synthesis Example 3 was applied to a copper foil by flow casting so that the thickness of a film after polyimidation might be 25 μm, and the same procedure as in Comparative Example 1 was then carried out to obtain a flexible metal-clad laminate.

The thus obtained flexible metal-clad laminate formed a curl having a diameter of 3.0 cm, but when the conductor has been removed after etching, any formation of the curl was not observed.

COMPARATIVE EXAMPLE 4

A polyimide precursor solution [II] was applied to a copper foil by flow casting so that the thickness of a film after polyimidation might be 6 μm, followed by drying at 100° C. for 5 minutes. The resultant polyimide precursor layer had a remaining solvent ratio of 75% and an imidation ratio of 8%.

A polyimide precursor solution [I] was applied onto this precursor layer by flow casting so that the thickness of a film after the imidation might be 24 μm, followed by drying at 100° C. for 10 minutes, by heating afterward up to 350° C. over one hour and then by heat curing at 350° C. for 30 minutes.

As a result, the precursor film became two layers of the polyimide, thereby obtaining a flexible metal-clad laminate.

The thus obtained flexible metal-clad laminate formed a curl having a diameter of 4.5 cm, and the film from which the conductor was removed after etching had a $Q_m$ value of 4.0 cm. The linear thermal expansion coefficient of the total polyimide film comprising the two layers was 1.9×10$^{-5}$/°C.

COMPARATIVE EXAMPLE 5

Polyimide precursor solutions [II] and [I] were mixed in a volume ratio of 4:1, and the mixture was then applied to a copper foil by flow casting so that the thickness of a polyimide film might be 30 μm, followed by drying at 100° C. for 10 minutes, by heating afterward up to 350° C. over one hour and then by heat curing at 350° C. for 30 minutes.

As a result, the precursor layer became a polyimide film layer, thereby obtaining a flexible metal-clad laminate.

The thus obtained flexible metal-clad laminate did not curl, but the film from which the conductor was removed after etching had a $Q_m$ value of 4.0 cm and the formation of the curl was observed. The linear thermal expansion coefficient of this polyimide layer was 2.0×10$^{-5}$/°C.

COMPARATIVE EXAMPLE 6

A polyimide precursor solution [IV] was applied to a copper foil by flow casting so that the thickness of a polyimide film after polyimidation might be 20 μm, followed by drying at 100° C. for 30 minutes and at 250° C. for 10 minutes. The resultant polyimide precursor had a remaining solvent ratio of 3% and an imidation ratio of 93%.

A polyimide precursor solution [VI] was applied to this precursor layer by flow casting so that the thickness of a film after the polyimidation might be 10 μm, followed by drying at 100° C. for 10 minutes, by heating afterward up to 350° C. over one hour and then by heat curing at 350° C. for 30 minutes.

As a result, the precursor film became two layers of the polyimide, thereby obtaining a flexible metal-clad laminate.

Interlaminar separation occurred between the first polyimide layer and the second polyimide layer of the obtained flexible metal-clad laminate, and any flexible metal-clad laminate having a desired film thickness could not be obtained.

COMPARATIVE EXAMPLE 7

A polyimide precursor solution [I] was applied to a copper foil by flow casting so that the thickness of a film after polyimidation might be 10 μm, followed by drying at 200° C. for 30 minutes. The resultant polyimide precursor had a remaining solvent ratio of 4% and an imidation ratio of 85%, and the film after the polyimidation had a $Q_1$ value of 0.3 cm. Next, a polyimide precursor solution [III] was applied onto this precursor layer by flow casting so that the thickness of a film after the polyimidation might be 15 μm, followed by drying at 100° C. for 10 minutes, by heating afterward up to 350° C. over one hour and then by heat curing at 350° C. for 30 minutes.

As a result, the precursor film became two layers of the polyimide, thereby obtaining a flexible metal-clad laminate.

The thus obtained flexible metal-clad laminate formed a curl having a diameter of 10 cm, and the film from which the conductor was removed after etching had a $Q_m$ value of −4.0 cm, that is, the formation of the reverse curl was observed. The linear thermal expansion coefficient of the total polyimide film comprising the two layers was $2.4 \times 10^{-5}$/°C.

COMPARATIVE EXAMPLE 8

A polyimide precursor solution [I] was applied to a copper foil by flow casting so that the thickness of a polyimide film after polyimidation might be 29 μm, followed by drying at 200° C. for 10 minutes.

The resultant polyimide precursor layer had a remaining solvent ratio of 6% and an imidation ratio of 85%, and the film after the polyimidation had a $Q_1$ value of 0.7 cm.

A polyimide precursor solution [II] was applied to this precursor layer by flow casting so that the thickness of a film after the polyimidation might be 1 μm, followed by drying at 130° C. for 5 minutes, by heating afterward up to 350° C. over one hour and then by heat curing at 350° C. for 30 minutes, thereby obtaining a flexible metal-clad laminate. Its $Q_1 \cdot t_n$ value was 0.7.

The thus obtained flexible metal-clad laminate did not curl, but the film from which the conductor was removed by etching formed the curl having a diameter of 7 cm.

SYNTHESIS EXAMPLE 8

Preparation of a Polyimide Precursor Solution [VII]

The same procedure as in Synthesis Example 1 was effected except that 67.64 g (0.338 mole) of DDE were used as a diamine component and 108.82 g (0.338 mole) of 3,3',4,4'-benzophenonetetracarboxylic acid dianhydride (BTDA) were used as an acid anhydride component, thereby obtaining a polyimide precursor solution [VII]. The viscosity of this polyimide precursor was 47000 cps.

The linear thermal expansion coefficient and the elasticity modulus of a polyimide film obtained in the same manner as in Synthesis Example 1 were $5.4 \times 10^{-5}$/°C. and 310 kg/mm², respectively.

SYNTHESIS EXAMPLE 9

Preparation of a Polyimide Precursor Solution [VIII]

The same procedure as in Synthesis Example 1 was effected except that 33.91 g (0.169 mole) of DDE and 46.96 g (0.207 mole) of 4,4'-diaminobenzanilide (hereinafter abbreviated to "DABAN") were used as diamine components, and 95.62 g (0.376 mole) of PMDA were used as an acid anhydride component, thereby obtaining a polyimide precursor solution [VIII]. The viscosity of this polyimide precursor was 78000 cps.

The linear thermal expansion coefficient of a polyimide film obtained in the same manner as in Synthesis Example 1 was $1.5 \times 10^{-5}$/°C.

COMPARATIVE EXAMPLE 9

A polyimide precursor solution [VIII] was applied to a copper foil by flow casting so that the thickness of a film after polyimidation might be 24 μm, followed by drying at 130° C. for 5 minutes. The resultant polyimide precursor layer, after the polyimidation, had a $Q_1$ value of 0.7 cm.

A polyimide precursor solution [VII] was applied to this precursor layer by flow casting so that the thickness of a film after the polyimidation might be 2 μm, followed by drying at 130° C. for 5 minutes, by heating afterward up to 350° C. over one hour and then by heat curing at 350° C. for 30 minutes, thereby obtaining flexible metal-clad laminate. Its $Q_{n-1} \cdot t_n$ value was 1.4.

The thus obtained flexible metal-clad laminate did not curl, even when the conductor was removed after etching, but the flexible metal-clad laminate formed a curl having a diameter of 7.5 cm.

Possibility of Industrial Utilization

A flexible metal-clad laminate of the present invention does not curl immediately after curing, and the curl does not occur even after the formation of a circuit by etching. Furthermore, a method for producing the flexible board of the present invention permits providing such an excellent flexible metal-clad laminate.

In addition, when the flexible metal-clad laminates of the present invention are utilized, excellent printed circuit boards and electronic devices can be provided.

We claim:

1. A flexible metal-clad laminate obtained by directly applying a polyimide precursor to a metallic conductive foil, and then drying, heating and curing the precursor to form a polyimide film in direct contact with and adhered to the metallic conductive foil, said flexible metal-clad laminate being characterized in that the polyimide film is composed of two or more polyimide layers, the each being at least 0.1 μm thick, linear thermal expansion coefficient of at least one of the second and later polyimide layers being larger than that of the first layer brought into contact with the metallic conductive foil with the linear thermal expansion coefficient of the second layer being about 1.05 to about 5 times greater than that of the first layer, and the requirements of the following formulae are met:

$$3.0 < Q_{n-1} \times t_n < 50,$$

$$t_{n-1} > t_n \text{ and}$$

$$0.01 < \frac{Rz}{t_{n-1} \times t_n} < 0.10$$

wherein $t_n$ is the thickness (μm) of the outermost layer (the nth layer) of the polyimide layers, $t_{n-1}$ is the thickness (μm) of the film comprising the first layer to the (n−1)th layer of the polyimide layers, $Q_{n-1}$ is double the value (cm) of the radius of curvature of the curl of the film comprising the first layer to the (n−1)th layer of the polyimide layers and Rz is the average surface roughness (μm) of the metallic conductive foil.

2. The flexible metal-clad laminate according to claim 1 wherein the linear thermal expansion coefficient of the first polyimide layer is in the range from $1.0\times10^{-5}$ to $2.3\times10^{-5}/°C$., and the linear thermal expansion coefficient of the whole laminated polyimide film is in the range from $1.5\times10^{-5}$ to $3.0\times10^{-5}/°C$.

3. The flexible metal-clad laminate according to claim 1 wherein the elasticity modulus of the first polyimide layer is in the range from 500 to 800 kg/mm².

4. The flexible metal-clad laminate according to claim 1 wherein the linear thermal expansion coefficient of the second polyimide layer is about 1.1 to about 3 times greater than that of the first layer.

5. A method for producing a flexible metal-clad laminate in which either surface of a metallic conductive foil is covered with two or more polyimide layers, said method comprising two or more steps of applying two or more polyimide precursor solutions to the metallic foil and then drying the solutions in turn to form a composite plate, and a step of heating and curing the composite plate in which the two or more polyimide precursor layers, each being at least 0.1 μm thick, formed on and adhered to the metallic conductive foil and wherein polyimide precursors used in the polyimide precursor layers are selected so that the linear thermal expansion coefficient of at least one of the second and later polyimide layers is larger than that of the first layer brought into contact with the metallic conductive foil with the linear thermal expansion coefficient of the second layer being about 1.05 to about 5 times greater than that of the first layer, and the requirements of the following formulae are met:

$$3.0 < Q_{n-1} \times t_n < 50,$$

$$t_{n-1} > t_n \text{ and}$$

$$0.01 < \frac{Rz}{t_{n-1} \times t_n} < 0.10$$

wherein $t_n$ is the thickness (μm) of the outermost layer (the nth layer) of the laminated polyimide layers, $t_{n-1}$ is the thickness (μm) of the film comprising the first layer to the (n−1)th layer of the laminated polyimide layers, $Q_{n-1}$ is double the value of the radius of curvature (cm) of the curl of the film comprising the first layer to the (n−1)th layer of the laminated polyimide layers and Rz is the average surface roughness (μm) of the metallic conductive foil.

6. The method for producing a flexible metal-clad laminate according to claim 5 wherein the polyimide precursors are selected so that the linear thermal expansion coefficient of the first polyimide layer is from $1.0\times10^{-5}$ to $2.3\times10^{-5}/°C$.

7. The method for producing a flexible metal-clad laminate according to claim 6 wherein the polyimide precursors are selected so that the linear thermal expansion coefficient of the second polyimide layer is larger than that of the first polyimide layer.

8. The method for producing a flexible metal-clad laminate according to claim 5 wherein the polyimide precursors are selected so that the elasticity modulus of the first polyimide layer is from 500 to 800 kg/mm².

9. The method for producing a flexible metal-clad laminate according to claim 7 wherein the number of the polyimide precursor layers is 3 or more, and the linear thermal expansion coefficient of the polyimide film obtained from the third and later precursor layers is larger than that of the polyimide layer brought into contact with the metallic foil.

10. The method for producing a flexible metal-clad laminate according to claim 5 wherein the amount of the remaining solvent contained in the polyimide precursor after the drying is in the range from 5 to 300% by weight with respect to the polyimide film obtained by later heating and curing the precursor, and the imidation range of the polyimide precursor is from 0 to 90%.

11. A flexible metal-clad laminate comprising a metallic conductive foil and a polyimide film in direction contact with and adhered to the metallic conductive foil, wherein the polyimide film is composed of two or more polyimide layers, each being at least 0.1 μm thick, the linear thermal expansion coefficient of at least one of the second and additional polyimide layers is larger than that of the first layer which is in direct contact with the metallic conductive foil with the linear thermal expansion coefficient of the second layer being about 1.05 to about 5 times greater than that of the first layer, and the requirements of the following formulae are met:

$$3.0 < Q_{n-1} \times t_n < 50,$$

$$t_{n-1} > t_n \text{ and}$$

$$0.01 < \frac{Rz}{t_{n-1} \times t_n} < 0.10$$

wherein $t_n$ is the thickness (μm) of the outermost layer (the nth layer) of the polyimide layers, $t_{n-1}$ is the thickness (μm) of the film comprising the first layer to the (n−1)th layer of the polyimide layers, $Q_{n-1}$ is double the value (cm) of the radius of curvature of the curl of the film comprising the first layer to the (n−1)th layer of the polyimide layers and Rz is the average surface roughness (μm) of the metallic conductive foil.

12. The flexible metal-clad laminate according to claim 11 wherein the linear thermal expansion coefficient of the first polyimide layer is in the range from $1.0\times10^{-5}$ to $2.3\times10^{-5}/°C$., and the linear thermal expansion coefficient of the whole laminated polyimide film is in the range from $1.5\times10^{-5}$ to $3.0\times10^{-5}/°C$.

13. The flexible metal-clad laminate according to claim 11 wherein the elasticity modulus of the first polyimide layer is in the range from 500 to 800 kg/mm².

14. The flexible metal-clad laminate according to claim 11 wherein the linear thermal expansion coefficient of the second polyimide layer is about 1.1 to about 3 times greater than that of the first layer.

15. The method for producing a printed circuit board which comprises the step of etching the flexible metal-clad laminate described in claim 1 to remove the unnecessary portions of a metallic conductor and to thereby form a circuit.

16. An electronic apparatus in which electronic parts are mounted on the printed circuit board formed by the method described in claim 15.

* * * * *

UNITED STATES PATENT AND TRADEMARK OFFICE
CERTIFICATE OF CORRECTION

PATENT NO. : 5,300,364
DATED : April 5, 1994
INVENTOR(S) : HASE et al.

It is certified that error appears in the above-indentified patent and that said Letters Patent is hereby corrected as shown below:

Column 20, line 47, change "the each being at least 0.1 µm thick," to --each being at least 0.1 µm thick, the--;

Column 22, line 18, change "direction" to --direct--.

Signed and Sealed this

Twentieth Day of September, 1994

Attest:

BRUCE LEHMAN

Attesting Officer         Commissioner of Patents and Trademarks